United States Patent [19]

Mihai

[11] Patent Number: 5,472,298
[45] Date of Patent: Dec. 5, 1995

[54] LOCATING RING POSITIONING APPARATUS FOR RE-SHARPENED DRILL BIT

[75] Inventor: Benjamin Mihai, Corona, Calif.

[73] Assignee: Tycom Limited Partnership, Santa Ana, Calif.

[21] Appl. No.: 182,889

[22] Filed: Jan. 13, 1994

[51] Int. Cl.⁶ .................................................. B23B 39/06
[52] U.S. Cl. .................................. 408/13; 29/407; 408/8
[58] Field of Search .................................. 408/8, 13, 18; 33/636, 637, 638; 29/407

[56] References Cited

U.S. PATENT DOCUMENTS

| | | | |
|---|---|---|---|
| 4,310,269 | 1/1982 | Neu et al. | 408/8 |
| 4,765,784 | 8/1988 | Karwan | 408/13 |
| 4,826,370 | 5/1989 | Conradsson | 33/638 |
| 4,881,858 | 11/1989 | Volk et al. | 33/638 |
| 5,123,789 | 6/1992 | Ohtani et al. | 408/13 |
| 5,139,376 | 8/1992 | Pumphrey | 408/1 R |
| 5,308,198 | 5/1994 | Pumphrey | 408/13 |

Primary Examiner—Irene Cuda
Assistant Examiner—Marc W. Butler
Attorney, Agent, or Firm—Stetina Brunda & Buyan

[57] ABSTRACT

An apparatus for adjusting the positioning of a locating ring upon a drill bit. The apparatus comprises a housing having a drill seat attached thereto for slidably receiving the shank portion of the drill bit. The apparatus further comprises an adjustment mechanism which is attached to the housing for positioning the cutting tip of the drill bit at a desired separation distance from the drill seat. Also included is a reciprocal ram assembly attached to the housing for selectively bumping the locating ring into abutting contact with the drill seat subsequent to the insertion of the shank portion into the drill seat and the positioning of the cutting tip at the selected distance relative the drill seat.

16 Claims, 6 Drawing Sheets

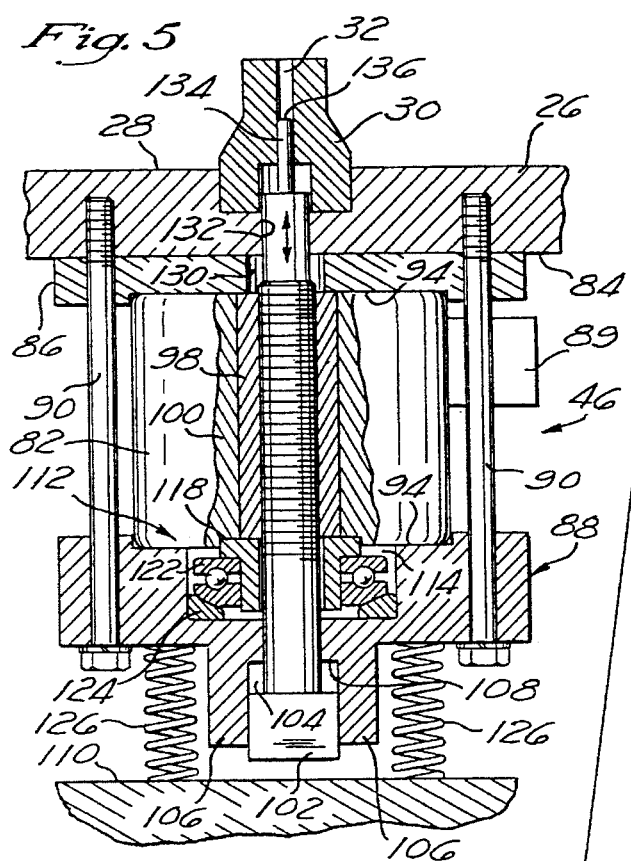
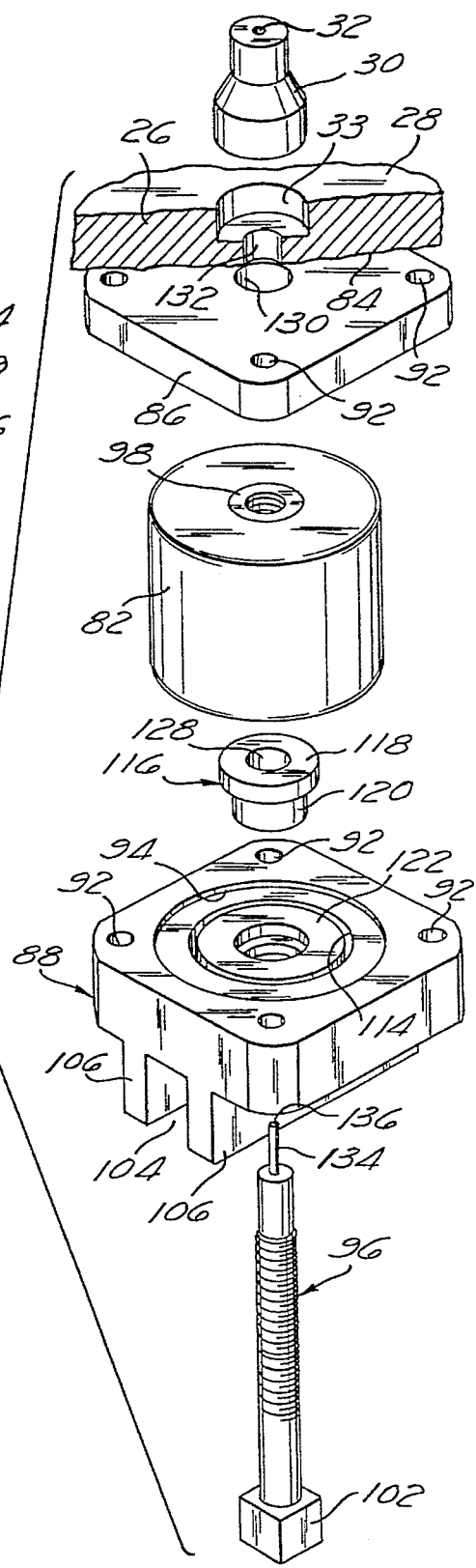
Fig. 5
Fig. 6

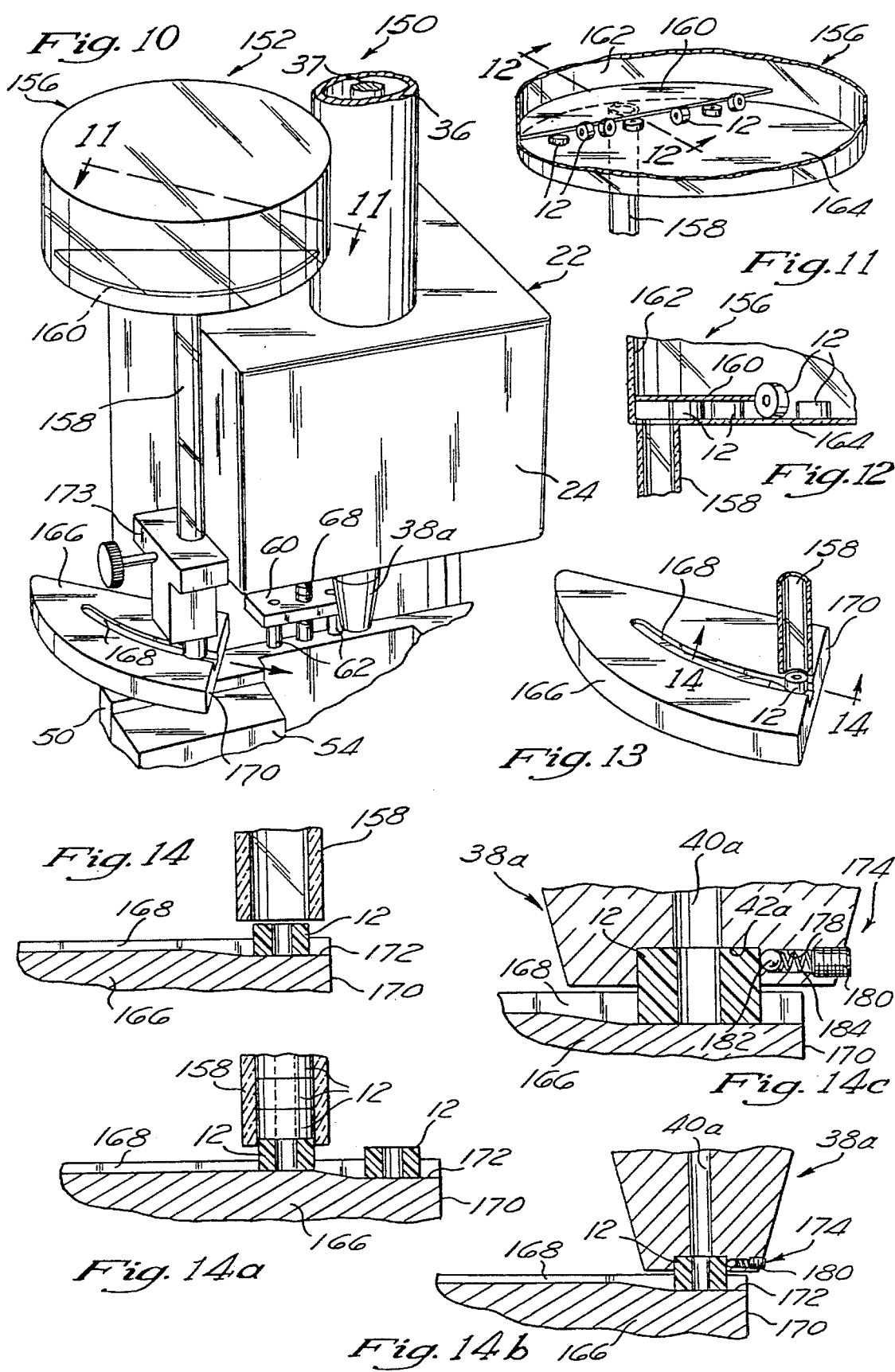

LOCATING RING POSITIONING APPARATUS FOR RE-SHARPENED DRILL BIT

FIELD OF THE INVENTION

The present invention relates generally to devices for re-sharpening machine tools, and more particularly to an apparatus for adjusting and/or positioning a locating ring upon the shank of a re-sharpened drill bit.

BACKGROUND OF THE INVENTION

In the prior art, the fabrication of printed circuit boards typically comprises the Step of drilling a plurality of small-diameter holes within the circuit board to accommodate the leads or pins of the various electrical components that are to be interfaced thereto. In most circuit board manufacturing processes, a plurality of circuit boards are typically drilled simultaneously by maintaining the circuit boards in a contiguous, overlapped orientation. As will be recognized, due to the extremely small diameter of the holes typically drilled into the circuit boards, the associated drill bits are formed having small diameter cutting tips and are fabricated from extremely hard materials such as tungsten carbide. Additionally, during the circuit board manufacturing process, the depth to which the cutting tip penetrates, i.e. extends into, the circuit boards must be tightly controlled. In this respect, conventional drill bits used to facilitate the drilling operation are generally provided with a locating ring disposed about the shank portion thereof which serves as a stop for accurately locating the drill bit, the collet or tool holder of the rotary drilling apparatus. Due to the importance of tightly controlling the penetration depth of the cutting tip into the circuit board(s), the distance separating the cutting tip from the locating ring must itself be tightly controlled, thus necessitating the precise positioning of the locating ring upon the shank portion of the drill bit.

In view of the difficulty and expense associated with the manufacture of carbide drill bits with small diameter cutting tips, once the cutting tip of the drill bit becomes dull, the same is typically re-sharpened rather than being discarded. However, the re-sharpening procedure often results in a slight loss of length from the cutting tip region of the drill bit. As will be recognized, since the distance separating the cutting tip from the locating ring must be maintained within a certain, tightly controlled range, the shortening of the drill bit which occurs as a result of the re-sharpening procedure requires that the position of the locating ring upon the shank portion be adjusted so as to reachieve the proper separation distance between the locating ring and the sharpened cutting tip.

Currently, the re-positioning of the locating ring upon the shank portion of the drill bit is typically accomplished manually through the utilization of conventional measurement techniques and devices such as calipers. However, such prior art re-positioning techniques are extremely time consuming and thus expensive, and oftentimes do not facilitate the positioning of the locating ring relative the cutting tip with the degree of accuracy needed to insure that the subsequent drilling operation will be properly conducted. The present invention specifically addresses these deficiencies in the prior art by providing an apparatus for automatically adjusting the positioning of a locating ring upon a drill bit subsequent to the re-sharpening of the cutting tip of the drill bit and/or automatically positioning such locating ring upon a drill bit.

SUMMARY OF THE INVENTION

In accordance with a first embodiment of the present invention, there is provided an apparatus for accurately adjusting the positioning of a locating ring upon a drill bit which comprises a housing and a drill seat attached to the housing for slidably receiving the shank portion of the drill bit. The apparatus further comprises an adjustment mechanism attached to the housing for positioning the cutting tip of the drill bit at a desired separation distance from the drill seat, and a reciprocal ram attached to the housing for selectively bumping the locating ring into abutting contact with the drill seat subsequent to the insertion of the shank portion into the drill seat and the positioning of the cutting tip at the separation distance relative the drill seat.

In the preferred embodiment, the adjustment mechanism comprises an optical reference system which produces a laser beam traveling perpendicularly relative the longitudinal axis of the drill bit and spaced from the drill seat by the separation distance. The adjustment mechanism further comprises a reversible stepper motor having a lead screw cooperatively engaged thereto which is selectively extensible from the stepper motor and retractable thereinto. The lead screw itself defines top and bottom ends, and is interfaced to the drill seat in a manner where the top end may selectively come into abutting contact with the bottom end of the shank portion of the drill bit inserted into the drill seat. The stepper motor is adapted to raise and/or lower the lead screw therewithin as needed to facilitate the precise placement of the cutting tip of the drill bit inserted into the drill seat into the path of the laser beam so as to position the cutting tip at the separation distance. Cooperatively engaged to the stepper motor and the lead screw is a thrust bearing for absorbing force transmitted through the lead screw when the locking ring is bumped by the ram.

The optical reference system of the adjustment mechanism is preferably attached to a slide assembly for selectively adjusting the separation distance of the laser beam from the drill seat. The slide assembly preferably comprises a support plate attached to the housing and at least one elongate guide rod attached to and extending between the support plate and the housing, with the optical reference system being slidably attached to the guide rod. Attached to and extending between the optical reference system and the housing is at least one, and preferably a pair, of biasing springs for biasing the optical reference system toward the support plate. Additionally, attached to the support plate is an adjustable micrometer stop mechanism which is in abutting contact with the optical reference system and is adapted to precisely set the separation distance of the laser beam from the drill seat.

In the preferred embodiment, the stop mechanism of the slide assembly comprises a stop pin which is cooperatively engaged to the support plate and defines an engagement surface in constant abutting contact with the optical reference system due to the biasing force exerted thereon by the biasing springs. The stop mechanism further comprises a micrometer cylinder disposed within the housing having a reciprocal piston rod extending therefrom, and a linkage, the opposed ends of which are attached to the piston rod and the stop pin. In the stop mechanism, the movement of the piston rod in a first direction is operable to retract the engagement surface of the stop pin toward the support plate, thus increasing the separation distance between the laser beam and the drill seat. Conversely, the movement of the piston rod in a second direction opposite the first direction is operable to extend the engagement surface away from the support plate, thus decreasing the separation distance between the laser beam and the drill seat.

The reciprocal ram included with the present apparatus preferably comprises an elongate cylinder attached to the housing and having a reciprocal piston rod extending axially therefrom. Attached to the distal end of the piston rod is a tool head which defines a central aperture in coaxial alignment with the longitudinal axis of the drill bit and sized to receive the cutting tip and shank portion thereof. Circumventing the central aperture is an annular bumping surface which is sized to contact the locating ring disposed about the shank portion when the cutting tip and the upper end of the shank portion are received into the central aperture of the tool head.

In accordance with a second embodiment of the present invention, the apparatus may further comprise a ring feed mechanism which is attached to the housing for initially feeding a locating ring onto the shank portion of the drill bit inserted into the drill seat. In the second embodiment, the ring feed mechanism comprises a feeder bowl attached to the housing which is adapted to accommodate a plurality of locating rings, and a feed tube having a top end in communication with the feeder bowl and a bottom end positioned adjacent a rotatable feed plate. The feed plate defines an arcuate feed groove disposed therein for receiving a single locating ring from the adjacent feed tube. The feed plate is selectively rotatable from a loading position whereat the locating ring is partially disposed within the groove below the feed tube and an unloading position whereat the locating ring is partially disposed within the groove but oriented out from underneath, i.e. away from, the feed tube. In the second embodiment, the distal portion of the central aperture disposed within the tool head is sized to partially receive the locating ring, with the tool head being further adapted to grasp the locating ring when the same is received into the distal portion of the central aperture. In addition to the foregoing components, the ring feeder mechanism also comprises a pressurized air source disposed proximate the feeder bowl and directed therewithin for creating an air stream to force locating rings disposed within the feeder bowl into the feed tube.

The drill seat included with the apparatus constructed in accordance with the second embodiment further comprises a locking mechanism for selectively locking the shank portion of a drill bit inserted into the drill seat therewithin. The locking mechanism preferably comprises a cylinder attached to the housing and a cylindrical locking pin extending axially from the cylinder which defines a distal end slidably engaged to the drill seat. The locking pin is selectively actuatable between an unlocked position whereat the distal end of the locking pin is spaced from the shank portion of the drill bit, and a locked position whereat the distal end of the locking pin is abutted against the shank portion of the drill bit inserted into the drill seat.

The apparatus constructed in accordance with the first embodiment of the present invention is preferably provided with a programmable control unit electrically interfaced to the ram, the optical reference, the stepper motor, and the slide assembly for controlling and coordinating the operations thereof. Similarly, the apparatus constructed in accordance with the second embodiment of the present invention is also provided with a programmable control unit which is electrically interfaced to the adjustment mechanism, the ram, the ring feed mechanism and the locking mechanism for controlling and coordinating the operations thereof.

Further in accordance with the present invention, there is provided a method for adjusting the positioning of a locating ring upon a drill bit having a shank portion and a cutting tip. The preferred method comprises the steps of inserting the shank portion of the drill into a drill seat, and producing an optical beam which travels perpendicularly relative the longitudinal axis of the drill bit above the cutting tip thereof, and is separated from the drill seat by a selected distance. Thereafter, the drill bit is adjusted within the drill seat as needed to facilitate the placement of the cutting tip into the path of the optical beam. Subsequent to the placement of the cutting tip into the optical beam, the locating ring is bumped into abutting contact with the drill seat, with the drill bit then being manually removed from the drill seat.

In the preferred method, the step of adjusting the drill bit within the drill seat further comprises the steps of determining the position of the optical beam relative the cutting tip, and raising the drill bit within the drill seat if the cutting tip is initially positioned below the optical beam so as to place the cutting tip within the optical beam. If the cutting tip is initially positioned above the beam, the drill bit is lowered into the drill seat to place the cutting tip below the beam, and is subsequently raised within the drill seat to place the cutting tip within the beam. If, after lowering the drill bit, the cutting tip is still positioned above the optical beam, the level of the beam is itself raised to position the cutting tip below the beam, with the drill bit subsequently being raised within the drill seat to place the cutting tip within the elevated optical beam. If, after raising the level of the optical beam, the cutting tip is still positioned below the beam, a spanner wrench may be positioned upon the shank portion of the drill bit, with the spanner subsequently being bumped to drive the shank portion downwardly through the locating ring into the drill seat and thus position the cutting tip below the optical beam. Thereafter, the drill bit is raised within the drill seat to place the cutting tip within the beam. The step of bumping the locating ring into abutting contact with the drill seat is preferably conducted twice to remove any flash and/or debris from the locating ring.

BRIEF DESCRIPTION OF THE DRAWINGS

These, as well as other features of the present invention, will become more apparent upon reference to the drawings wherein.

FIG. 5 is a cross-sectional view of an adjustment mechanism of the apparatus for selectively raising and lowering the drill bit within the drill seat;

FIG. 6 is an exploded view of the adjustment mechanism shown in FIG. 5;

Figure 9:
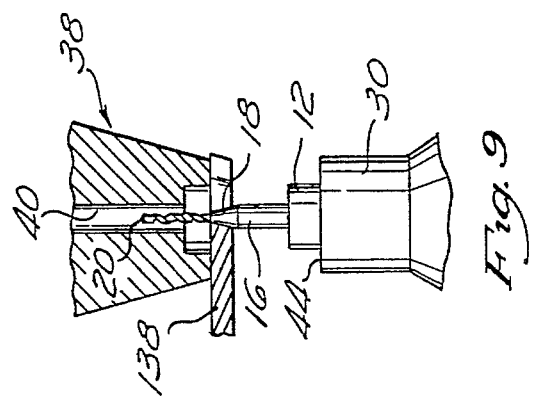

8 is a respective view of a spanner wrench which may be utilized in conjunction with the present apparatus;

FIG. 9 is a cross-sectional view illustrating the manner in which the banner wrench engages the drill bit and the reciprocating ram engages the spanner wrench;

FIG. 10 is a partial perspective view of a locating ring positioning apparatus constructed in accordance with a second embodiment of the present invention and including a ring feed mechanism associated therewith;

FIG. 11 is a partial perspective view of a feeder bowl of the ring feed mechanism shown in FIG. 10;

FIG. 12 is a cross-sectional view taken along line 12—12 of FIG. 11;

FIG. 13 is a perspective view of a rotatable feed plate of the ring feed mechanism shown in FIG. 10;

FIG. 14 is a cross-sectional view taken along line 14—14 of FIG. 13

FIG. 14a is a cross-sectional view illustrating the manner in which locating rings travel from a feed tube of the ring feed mechanism into an arcuate slot formed within the feed plate;

FIG. 14b is a cross-sectional view illustrating the receipt of a locating ring partially disposed within the feed plate into the tool head of the reciprocating ram;

FIG. 14c is an enlarged showing of FIG. 14b; and

Figure 15:
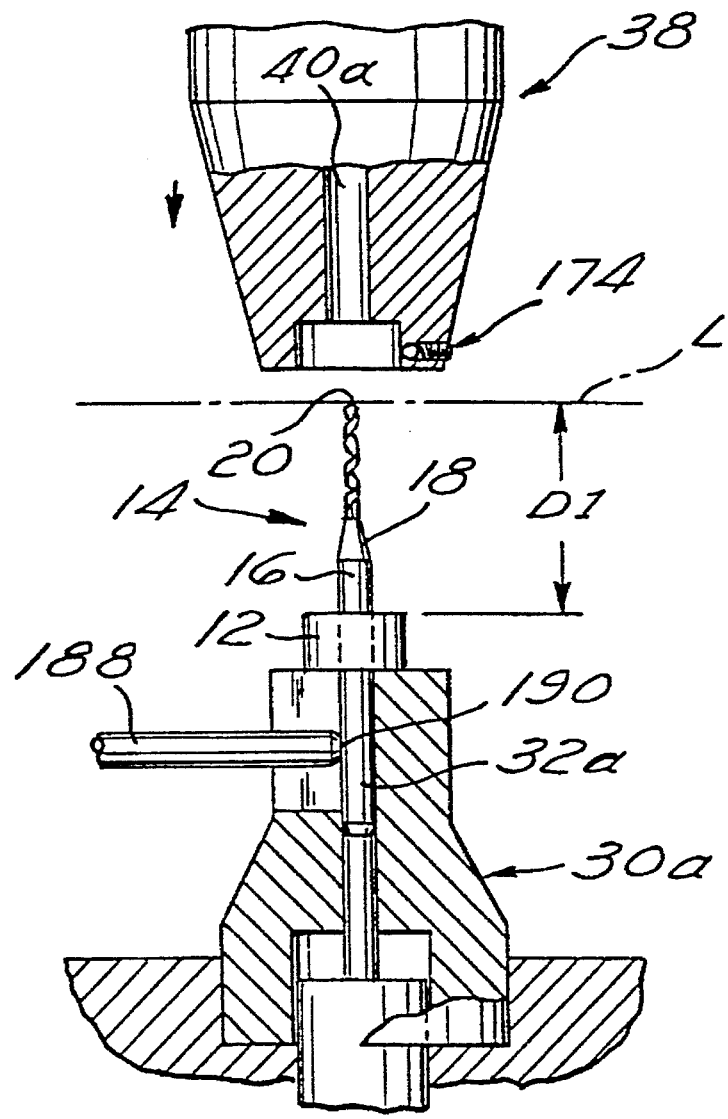

FIG. 15 is a cross-sectional view illustrating the engagement of the locking pin of a locking mechanism to the shank portion of a drill bit inserted into the drill seat.

DETAILED DESCRIPTION OF THE PREFERRED EMBODIMENTS

Figure 1:
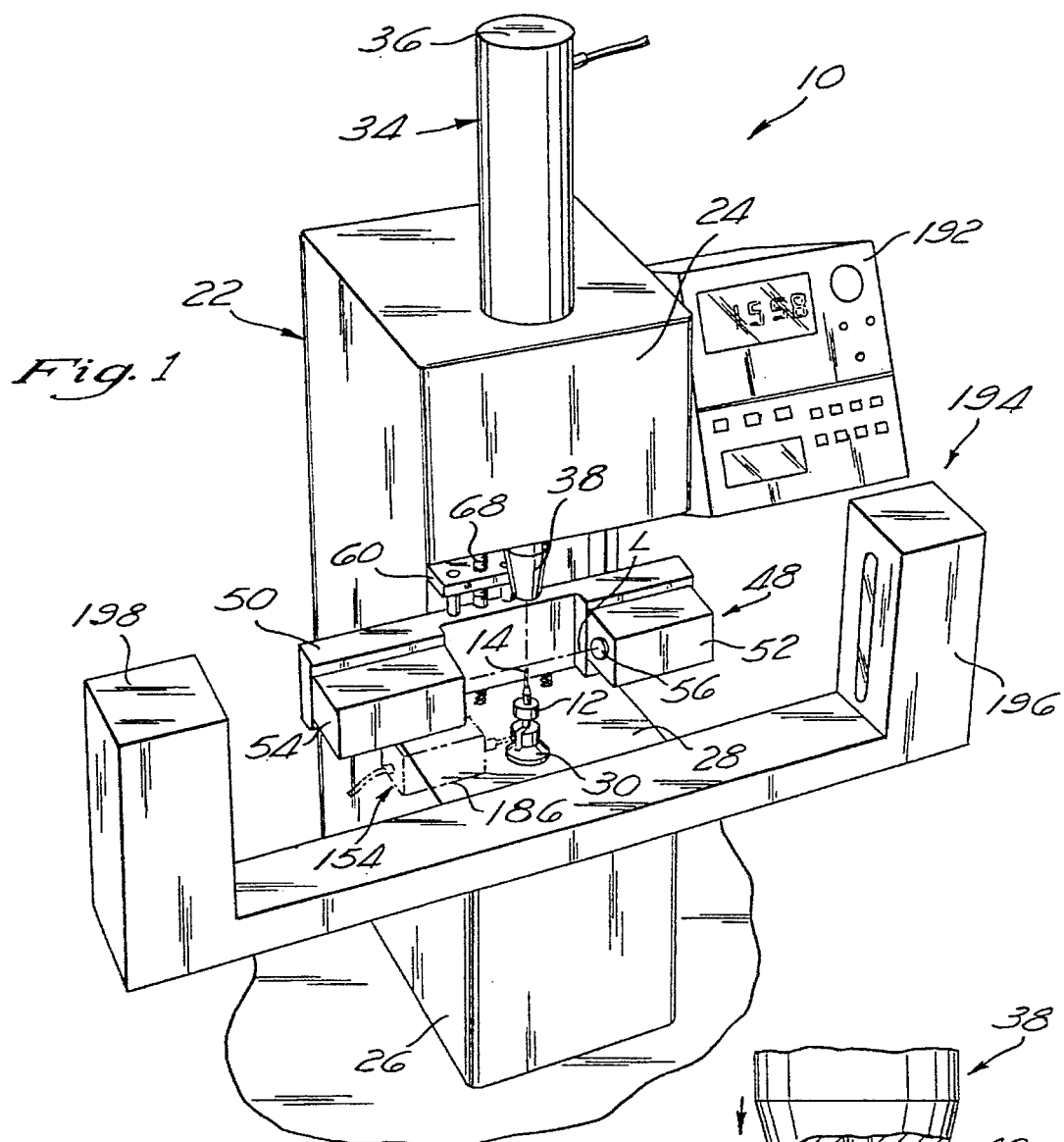
FIG. 1 is a front perspective view of a locator ring positioning apparatus constructed in accordance with a first embodiment of the present invention.
Figure 2:
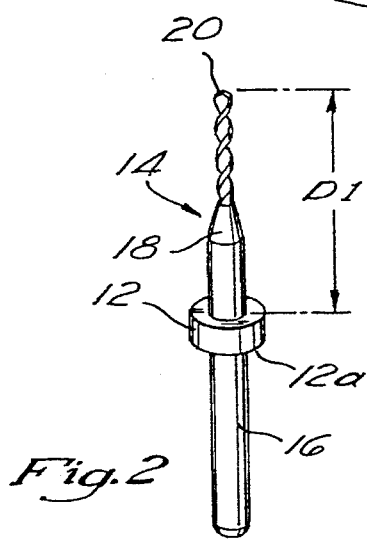
FIG. 2 is a perspective view of a drill bit having a locating ring positioned on the shank portion thereof.

Referring now to the drawings wherein the showings are for purposes of illustrating preferred embodiments of the present invention only, and not for purposes of limiting the same, FIGS. 1 and 2 perspectively illustrate a locating ring positioning apparatus 10 constructed in accordance with a first embodiment of the present invention. As will become more apparent infra, the apparatus 10 is utilized to automatically adjust the position of an annular locating ring 12 upon a resharpened drill bit 14, and more particularly the cylindrically configured shank portion 16 of the drill bit 14. In addition to the shank portion 16, the drill bit 14 includes a fluted cutting region which is separated from the shank portion 16 by a tapered region 18, and defines a cutting tip 20.

As previously explained, the drill bit 14 is typically fabricated from carbide, and utilized in relation to the assembly of printed circuit boards. In particular, the drill bit 14 is used to form a plurality of small diameter holes within a single circuit board or a plurality of overlapped circuit boards for accommodating the pins or leads of the electrical components which are to be subsequently interfaced to the circuit board(s). As also previously explained, the depth to which the cutting tip 20 of the drill bit 14 penetrates, i.e. is extended into, the circuit board(s) must be accurately controlled to insure proper drilling tolerances. Such depth control is typically accomplished through the axial positioning of the frictionally mounted locating ring 12 about the shank portion 16 of the drill bit 14. In this respect, the extension of the shank portion 16 into the collet or tool holder of the drilling apparatus (not shown) is limited by the abutment of the upper surface 12a of the locating ring 12 thereagainst. Since the locating ring 12, and more particularly the upper surface 12a thereof, serves as a "stop" for controlling the length of the cutting tool which extends from the tool holder, the distance D1 separating the cutting tip 20 from the locating ring 12 must be maintained within a certain, close tolerance range to insure proper circuit board drilling.

Due to the expense associated with the manufacture of the carbide drill bit 14, after prolonged use, the cutting tip 20 thereof is typically re-sharpened rather than the drill bit 14 being discarded. However, the resharpening of the cutting tip 20 generally results in a decrease in the length of the fluted cutting region, thus lessening the distance D1 separating the cutting tip 20 from the locating ring 12. As such, after the resharpening procedure has been conducted, the position of the locating ring 12 upon the shank portion 16 must be adjusted to reachieve the proper distance D1 separating the cutting tip 20 from the locating ring 12. In the prior art, the re-positioning of the locating ring 12 upon the shank portion 16 is typically done manually or semi-manually with the use of conventional measurement instruments and techniques. However, the use of these prior art methods, in addition to being time-consuming, often does not facilitate the required level of accuracy in the distance D1 separating the cutting tip 20 from the locating ring 12.

Referring now to FIG. 1, the apparatus 10 constructed in accordance with the first embodiment of the present invention generally comprises a housing 22 defining an upper portion 24 and a lower portion 26, with the lower portion 26 itself defining a top surface 28. Attached to the top surface 28 of the lower portion 26 is a generally *cylindrical drill seat or anvil 30 which defines an aperture 32 extending axially therethrough for slidably receiving the shank portion 16 of the drill bit 14. The diameter of the aperture 32 (FIG. 3) is sized so as to slightly exceed the diameter of the shank portion 60, thus facilitating the slidable receipt of the shank portion 16 (FIG. 1) thereinto. The attachment of the drill seat 30 to the lower portion 26 is facilitated by the insertion of the bottom end thereof into a complimentary annular recess 33 (FIG. 6) disposed within the top surface 28 of the lower portion 26.

Attached to the upper portion 24 of the housing 22 is a reciprocal ram or hammer assembly 34. In the first embodiment, the ram assembly 34 comprises a pneumatic cylinder 36 which is attached to the top surface of the upper portion 24 and includes a reciprocal piston rod 37 (FIG. 10) extending axially therefrom and through the upper portion 24 of the housing 22. Attached to the distal end of the piston rod 37 (FIG. 10) is an enlarged tool head or hammer 38 defining a central aperture 40 (FIG. 3) extending axially therethrough which is slightly larger in diameter than the aperture 32 (FIG. 3) extending axially through the drill seat 30. Importantly, the ram assembly 34 and drill seat 30 are attached to the housing 22 in a manner wherein the central aperture 40 (FIG. 3) of the tool head 38 is in coaxial alignment with the aperture 32 of the drill seat 30 and thus in coaxial alignment with the longitudinal axis of the drill bit 14 inserted into the drill seat 30.

Figure 3:
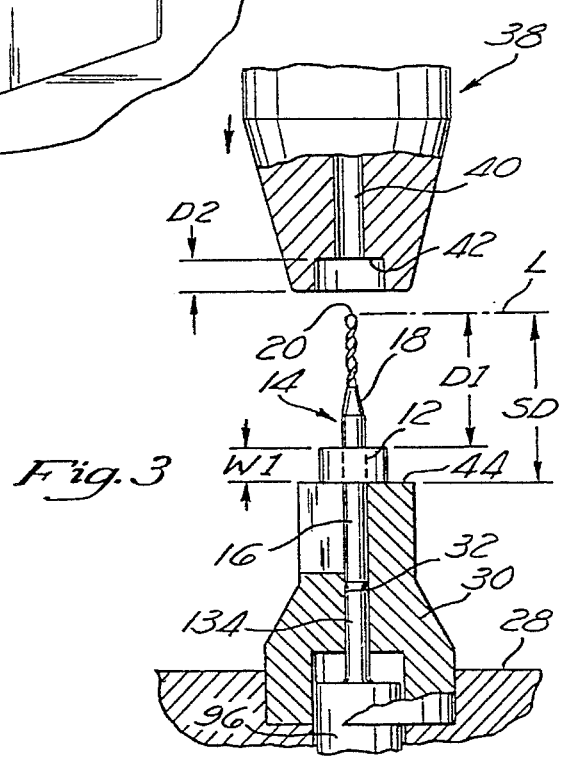
FIG. 3 is a cross-sectional view illustrating the longitudinal alignment of a drill bit inserted into the drill seat of the apparatus with a reciprocating bumping ram of the apparatus.

As seen in FIG. 3, the distal portion of the central aperture 40 is enlarged and sized to partially receive the locating ring 12 positioned upon the drill bit 14. In this respect, the diameter of the enlarged portion slightly exceeds the diameter of the locating ring 12, with the depth D2 of the enlarged portion being slightly less than the width W1 of the locating ring 12. As further seen in FIG. 3, the enlargement of the distal portion of the central aperture 40 facilitates the formation of an annular bumping surface 42 which circumvents the reduced diameter portion of the central aperture 40, and is adapted to contact the upper surface 12a of the locating ring 12. As will be described in more detail infra, when the drill bit 14 is inserted into the drill seat 30 and the cylinder 36 actuated to facilitate the downward movement of the tool head 38, the fluted cutting portion, tapered region 18 and upper end of the shank portion 16 of the drill bit 14 are received into the central aperture 40, with the locating ring 12 being "bumped" by the bumping surface 42 so as to force the locating ring 12 into abutting contact with the top surface 44 of the drill spat 30. Since, as previously specified, the diameter of the central aperture 40 exceeds the diameter of the aperture 32, the entire upper end of the drill bit 14 is easily received thereinto, even with rapid movement of the tool head 38.

Referring now to FIGS. 1–6, the apparatus 10 further comprises an adjustment mechanism for positioning the cutting tip 20 of a drill bit 14 inserted into the drill seat 30 at a desired separation distance SD from the top surface 44 thereof. In the preferred embodiment, the adjustment mechanism comprises an optical reference system preferably including a laser bar assembly 48 adapted to produce a laser beam L which travels perpendicularly relative the longitudinal axis of the drill bit 14 and is spaced (i.e., separated from) the top surface 44 of the drill seat 30 by the separation distance SD. The optics laser bar assembly 48 comprises an elongate base plate 50 having a laser emitting module 52 and a laser receiving module 54 attached thereto in opposed, spaced relation. The laser emitting and receiving modules 52, 54 define lenses 56 which are in horizontal alignment with each other when the modules 52, 54 are attached to the base plate 50. As previously specified, the laser beam L produced by the laser bar assembly 48 travels perpendicularly relative the longitudinal axis of the drill bit 14 inserted into the drill seat 30. As such, the laser bar assembly 48, and more particularly the laser emitting and receiving modules 52, 54, are oriented relative the drill seat 30 such that the axis of the aperture 32 (as well as the axis of the central aperture 40) extends transversely through the laser beam L extending horizontally between the lenses 56 of the laser emitting and receiving modules 52, 54. Importantly, no component of the laser bar assembly 48 directly contacts the locating ring 12 or drill bit 14. Although in the preferred embodiment, a laser optical system is utilized, those skilled in the art will recognize that alternative optical and/or other reference line systems are contemplated herein.

Figure 4:
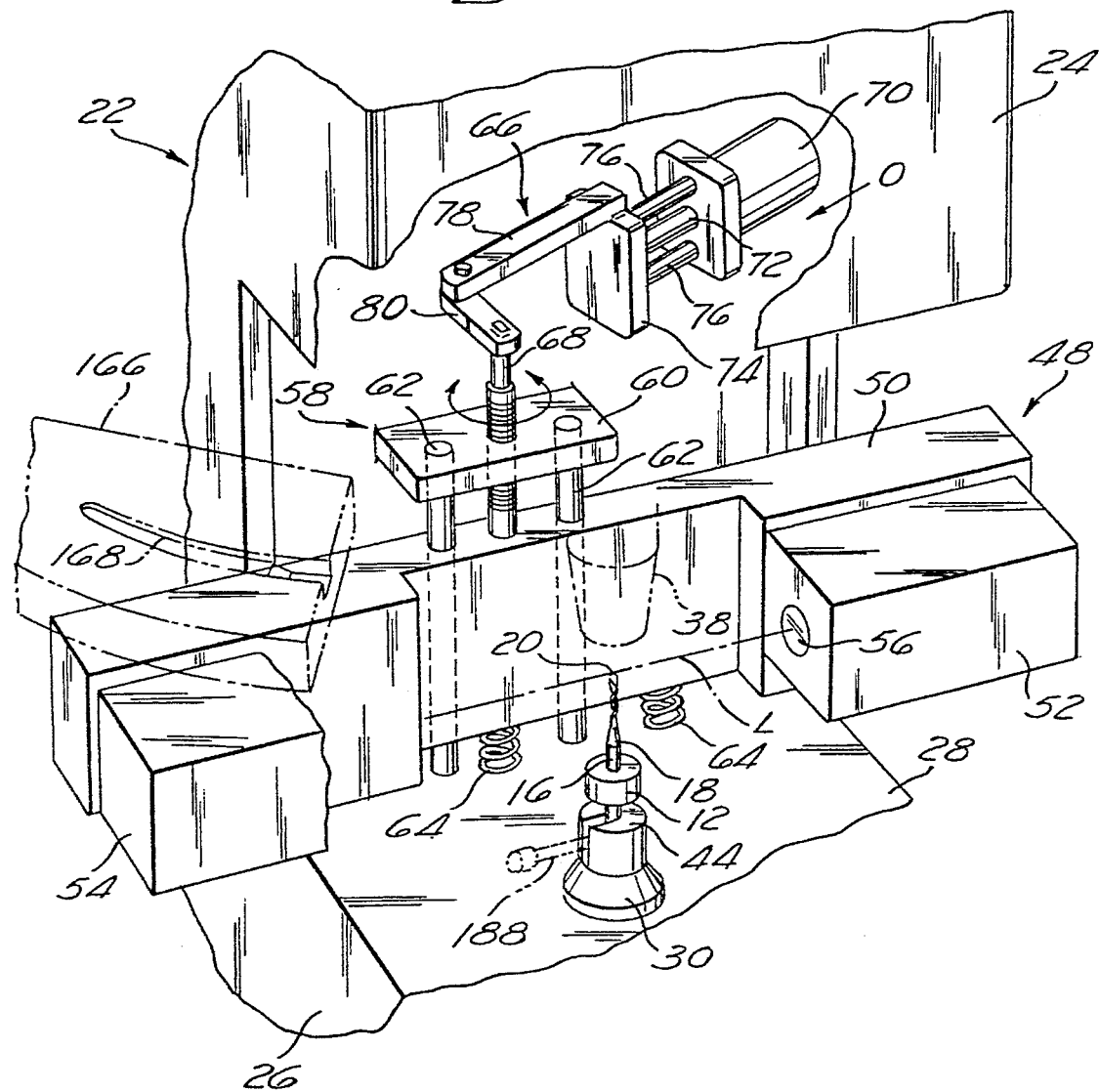
FIG. 4 is a front, cut-away perspective view illustrating a slide assembly for selectively adjusting the height of an optical beam produced by an optical reference system of the present apparatus relative the drill seat.

As best seen in FIG. 4, the laser bar assembly 48 is attached to a slide assembly 58 for selectively adjusting the separation distance SD of the laser beam L from the top surface 44 of the drill seat 30. In the preferred embodiment, the slide assembly 58 comprises a rectangularly configured support plate 60 which is rigidly attached to the housing 22 intermediate the upper and lower portions 24, 26 thereof. Attached to and extending between the support plate 60 and the top surface 28 of the lower portion 26 in spaced, parallel relation is a pair of elongate, cylindrically configured guide rods 62. In the preferred embodiment, the laser bar assembly 48 is slidably attached to the slide assembly 58 via the extension of the guide rods 62 through complimentary apertures extending vertically through the base plate 50 of the laser bar assembly 48. Attached to and extending between the bottom surface of the base plate 50 and the top surface 28 of the lower portion 26 is a pair of helical biasing springs 64 for biasing the laser bar assembly 48 upwardly toward the support plate 60. Due to the slidable engagement of the laser bar assembly 48 to the slide assembly 58, and more particularly the base plate 50 to the guide rods 62, the horizontal level of the laser beam L produced by the laser bar assembly 48 and hence the separation distance SD may be selectively increased or decreased by sliding the base plate 50 upwardly or downwardly along the vertical guide rods 62.

Attached to the support plate 60 of the slide assembly 58 is an adjustable micrometer stop mechanism 66 for setting the separation distance SD of the laser beam L from the top surface 44 of the drill seat 30. As best seen in FIG. 4, the stop mechanism 66 comprises an elongate, cylindrically configured stop pin 68 defining top and bottom ends and a partially threaded outer surface. In the preferred embodiment, the stop pin 68 is threadably engaged to the slide assembly 58 via the receipt thereof into a complimentary, internally threaded aperture disposed within the support plate 60. The bottom end of the stop pin 68 defines an engagement surface which is in constant abutting contact with the top surface of the base plate 50 when the stop pin 68 is extended through the support plate 60, due to the upward biasing force exerted on the base plate 50 by the biasing springs 64.

In addition to the stop pin 68, the stop mechanism 66 further comprises a pneumatic cylinder 70 disposed within the housing 22 and having a reciprocal piston rod 72 extending axially therefrom. Attached to the distal end of the piston rod 72 is an end plate 74 which is prevented from rotating by a pair of pins 76 extending from the inner surface thereof into the cylinder 70. Attached to and extending between the end plate 74 and stop pin 68 is a linkage assembly comprising a primary link member 78 and a secondary link member 80. One end of the primary link member 78 is rigidly attached to an edge portion of the end plate 74, with the opposite end being pivotally connected to one end of the secondary link member 80. The end of the secondary link member 80 opposite the end connected to the primary link member 78 is rigidly attached to the top end of the stop pin 68. Due to this manner of interconnection, the movement of the piston rod 72 and end plate 74 outwardly away from the cylinder 70 causes the stop pin 68 to rotate in a counter-clockwise direction thus retracting the engagement surface thereof toward the support plate 60 and increasing the separation distance SD due to the resultant upward movement of the laser bar assembly 48 along the slide assembly 58. Conversely, the movement of the piston rod 72 and end plate 74 in the opposite direction, i.e., toward the cylinder 70, is operable to rotate the stop pin 68 in a clockwise direction thus extending the engagement surface of the stop pin 68 away from the support plate 60 and decreasing the separation distance SD due to the downward movement of the laser bar assembly 48 along the slide assembly 58. As such, by selectively controlling the amount by which the piston rod 72 is extended from and retracted into the cylinder 70, the corresponding rotation of the stop pin 68 and thus the positioning of the engagement surface thereof relative the bottom surface of the support plate 60 may be precisely controlled. In this respect, minor increases or decreases in the elevation of the engagement surface relative the top surface 44 of the drill seat 30 results in corresponding increases or decreases in the separation distance SD between the laser beam L and the top surface 44. Though not shown, the stop pin 68 may comprise a conventional micrometer having one end of the secondary link member 80 engaged thereto.

Referring now to FIGS. 3, 5 and 6, in addition to the optical laser bar assembly 48 and slide assembly 58, the adjustment mechanism of the apparatus 10 comprises a reversible linear actuator or stepper motor 82. As seen in FIG. 5, the stepper motor 82 is disposed within the lower portion 26 of the housing 22 and rigidly mounted directly to the upper interior surface 84 thereof. In the preferred embodiment, such mounting is facilitated by initially placing the stepper motor 82 between an upper mounting plate 86 and a lower mounting plate 88. Thereafter, elongate fasteners such as bolts 90 are extended through complimentary, coaxially aligned apertures 92 disposed within the upper and lower mounting plates 86, 88 and threadably received into corresponding, internally threaded apertures disposed within the upper interior surface 84 of the lower portion 26. The tightening of the bolts 90 "sandwiches" the stepper motor 82 between the inner surfaces of the upper and lower mounting plates 86, 88. The proper initial orientation of the stepper motor 82 between the upper and lower mounting plates 86, 88, is facilitated by the receipt of the opposed ends of the stepper motor 82 into complimentary, annular recesses 94 formed in the inner surfaces of the upper and lower mounting plates 86, 88. Advantageously, the placement of the ends of the stepper motor 82 into the recesses 94 aids in preventing any shifting or displacement thereof between the upper and lower mounting plates 86, 88, even after the bolts 90 are tightened. Electrically coupled to the stepper motor 82 is an electronic counter 89, the use of which will be discussed below.

Cooperatively engaged to the stepper motor 82 is an elongate lead screw 96 which is selectively extensible from the stepper motor 82 and retractable thereinto. In particular, the lead screw 96 is threadably engaged to an elongate bushing 98 which is itself disposed within the stepper motor 82 and operatively interfaced to the rotating magnet elements 100 thereof in a manner wherein the rotation of the magnet elements 100 causes the concurrent rotation of the bushing 98. The engagement of the lead screw 96 to the bushing 98 is facilitated by the extension of the externally threaded outer surface region of the lead screw 96 through the internally threaded bore defined by and extending longitudinally through the bushing 98. Due to the threaded engagement of the lead screw 96 to the bushing 98, and the interface of the outer surface of the bushing 98 to the magnet elements 100, the rotation of the magnet elements 100 in a clockwise direction facilitates the upward vertical movement of the lead screw 96 relative the stepper motor 82. Conversely, the rotation of the magnet elements 100 in a counter-clockwise direction facilitates the downward vertical movement of the lead screw 96 relative the stepper motor 82.

As will be recognized, to facilitate the vertical travel of the lead screw 96 in the aforementioned manner, the lead screw 96 must be prevented from rotating concurrently with the bushing 98 and magnet elements 100. To prevent any such rotation of the lead screw 96 from occurring, a base block 102 is provided which resides within an elongate guide slot 104 defined within the lower mounting plate 88 by a pair of opposed flange portions 106 extending downwardly therefrom in spaced, parallel relation. As shown in FIG. 5, the width of the guide slot 104, i.e., the distance separating the inner surfaces of the flange portions 106, is sized to exceed the width of the base block 102, thus allowing the same to be slidably movable therewithin. Importantly, the height of the base block 102 and depth of the guide slot 104 are selected in relation to each other such that the base block 102 is at least partially disposed within the guide slot 104 throughout the desired range of travel of the lead screw 96.

Disposed intermediate the lower end of the bushing 98 and the lower mounting plate 88 is a thrust-bearing assembly 112. The thrust-bearing assembly 112 resides within a bore 114 disposed centrally within the recess 94 of the lower mounting plate 88 and comprises a thrust bushing 116 defining an upper flange portion 118, the top surface of which is disposed in abutting contact with the lower end of the bushing 98, and a cylindrical portion 20 having a thrust bearing 122 positioned about the outer surface thereof. The thrust bearing assembly 112 further comprises an annular thrust washer 124 which is disposed between the thrust bearing 122 and the bottom surface of the bore 114, and defines a beveled surface against which the thrust bearing 122 is abutted. When a downward force is applied to the top end of the lead screw 96, such force is transmitted to the bushing 98 due to the threaded engagement of the lead screw 96 thereto. Due to the configuration of the thrust bearing assembly 112, the downward force transmitted through the bushing 98 will be transmitted to the bottom surface of the recess 14 and hence the lower mounting plate 88 via the thrust bearing assembly 112, i.e., the thrust bushing 116, thrust bearing 122 and thrust washer 124. Transmitting a downward force applied to the top end of the lead screw 96 to the lower mounting plate 88 in this manner serves to reduce damage to the stepper motor associated with repetitive operations as will be discussed in more detail infra. Attached to and extending between the lower interior surface 110 of the housing 22 and the outer surface of the lower mounting plate 88 is a pair of helical dampening springs 126.

As further seen in FIG. 5, when the lead screw 96 is threadably engaged to the bushing 98 and the stepper motor 82 mounted to the upper interior surface 84, the lower end of the lead screw 96 extends through the bore 128 of the thrust bushing 116, and into the guide slot 104 via an aperture extending between the bottom surface of the bore 114 and the bottom surface 108 of the guide slot 104. The upper end of the lead screw 96 extends through an aperture 130 disposed centrally within the upper mounting plate 86 and into an enlarged lower portion of the aperture 32 via an aperture 132 extending through the lower portion 26 from the upper interior surface 84 thereof to the bottom surface of the annular recess 33.

Extending axially from the top end of the lead screw 96 is an elongate, cylindrically configured pin portion 134 which defines a blunt, i.e., generally flat, distal end 136. The diameter of the non-threaded upper end portion of the lead screw 96 is less than the diameter of the enlarged lower portion of the aperture 32, with the diameter of the pin portion 134 being slightly less than the diameter of the remainder of the aperture 32, thus allowing the pin portion 134 to be slidably extensible into the aperture 32 and vertically movable therewithin. As will be recognized, to facilitate the receipt of the pin portion 134 into the aperture 132, the stepper motor 82 must be mounted to the upper interior surface 84 in a manner wherein the lead screw 96 threadably engaged thereto, and more particularly the pin portion 134 thereof, is in coaxial alignment with the aperture 32. When the stepper motor 82 is mounted to the lower portion 26 of the housing 22 in this manner, the rotation of the magnet elements 100 and bushing 98 in a clockwise direction is operable to raise the level of the distal end 136 of the pin portion 134 within the aperture 32. Conversely, the rotation of the magnet elements 100 and bushing 98 in a counter-clockwise direction is operable to lower the level of the distal end 136 within the aperture 32. Importantly, the pin portion 134 of the lead screw 96 is sized such that the distal end 136 thereof remains disposed within the reduced diameter portion of the aperture 32 throughout the entire range of vertical travel of the lead screw 96. In this respect, as can be seen in FIG. 5, the distal end 136 will remain within the reduced diameter portion of the aperture 32 when the base block 102 is abutted against the lower interior surface 110, and will not protrude from the top end of the aperture 32 when the base block 102 is abutted against the bottom surface 108 of the guide slot 104. However, as will hereinafter be described, the apparatus 10 is typically operated in a manner wherein the lead screw 96 does not reach the upper and lower limits of its vertical travel. Due to the constant positioning of the distal end 136 within the aperture 132, the bottom end of the shank portion 16 typically comes into direct contact therewith when the drill bit 14 is inserted into the aperture 32 of the drill seat 30.

Having thus described the primary components comprising the apparatus 10 constructed in accordance with the first embodiment of the present invention, the operation thereof may now be described. As previously explained, the apparatus 10 is utilized to space the cutting tip 20 of the resharpened drill bit 14 from the locating ring 12 by the desired distance D1. Since the width W1 of the locating ring 12 is known, as is the desired distance D1, designating the separation distance SD between the cutting tip 20 and the top surface 44 as the sum of the distance D1 and the width W1 insures that by positioning the cutting tip 20 at the separation distance SD and subsequently bumping the locating ring 12 into abutting contact with the top surface 44, the locating ring 12 will be separated from the cutting tip 20 by the desired distance D1.

Figure 7:
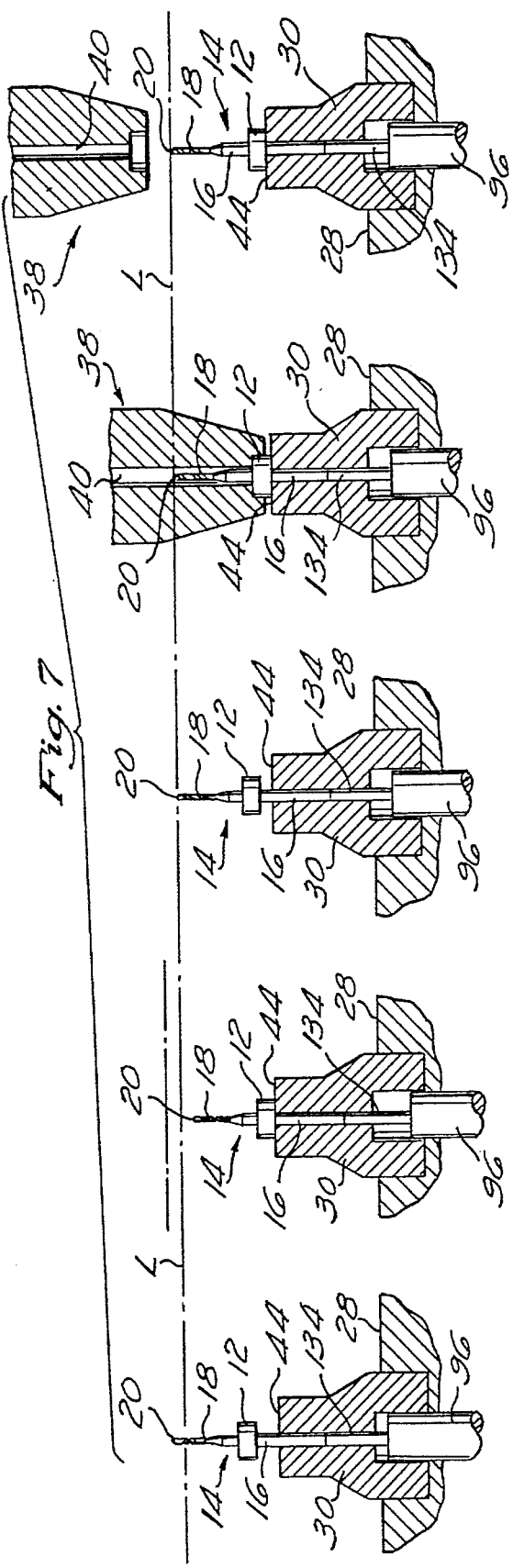
FIG. 7 comprises cross-sectional views illustrating the sequence of steps conducted by the present apparatus for properly positioning the locating ring upon the drill bit; FIG.
Figure 8:
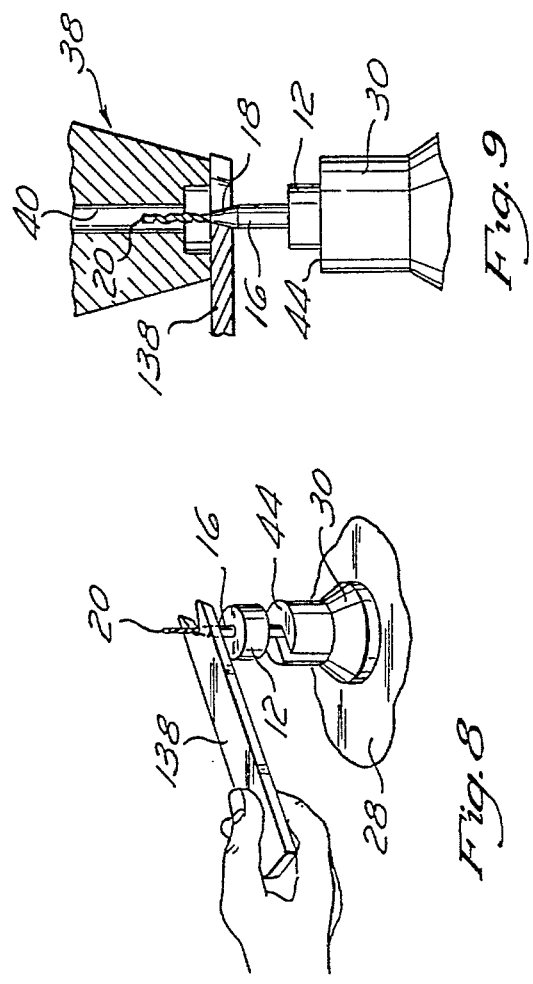

Referring now to FIGS. 7–9, the apparatus 10 is utilized by initially inserting the shank portion 16 of the drill bit 14 into the aperture 32 of the drill seat 30. The insertion of the shank portion 16 into the aperture 32 is limited by the abutment of the bottom end thereof against the distal end 136 of the pin portion 134 which, as previously specified, resides within the reduced diameter portion of the aperture 32. Typically, when the drill bit 14 is initially inserted into the drill seat 30, the distal end 136 of the pin portion 134 resides at approximately the mid-point of the reduced diameter portion of the aperture 32.

Subsequent to the insertion of the drill bit 14 into the drill seat 30, the optical laser beam L is transmitted horizontally between the lenses 56 of the laser emitting and receiving modules 52, 54. As previously specified, the laser beam L travels perpendicularly relative the longitudinal axis of the drill bit 14 inserted into the drill seat 30. Additionally, the laser bar assembly 48 is initially oriented such that the laser beam L produced thereby is separated from the top surface 44 of the drill seat 30 by the separation distance SD which is preferably the sum of the distance D1 and the width W1 of the locating ring 12. When the drill bit 14 is initially inserted into the drill seat 30, the cutting tip 20 is typically disposed above the level of the laser beam L. As such, since the cutting tip 20 must be positioned at the separation distance SD prior to bumping the locating ring 12, the drill bit 14 must be lowered within the drill seat 30 so as to precisely position the cutting tip 20 within the laser beam L.

The lowering of the drill bit 14 within the drill seat 30 is accomplished by activating the stepper motor 82 in a manner facilitating the counter-clockwise rotation of the magnet elements 100. In this respect, the resultant counter-clockwise rotation of the bushing 98 causes the lead screw 96 to move in a downward vertical direction which in turn causes the distal end 136 of the pin portion 134 to move downwardly within the aperture 32. Since the bottom end of the shank portion 16 is abutted against the distal end 136 when the drill bit 14 is initially inserted into the drill seat 30, the downward movement of the distal end 136 causes the shank portion 16 to be retracted into the drill seat 30, thus lowering the level of the cutting tip 20.

In the preferred embodiment, the downward vertical movement of the lead screw 96 is continued to such time as the cutting tip 20, is disposed below the laser beam L. As will be recognized, when the cutting tip 20 is disposed above the laser beam L, the path of the laser beam L is interrupted by the fluted cutting region of the drill bit 14 since the laser beam L travels perpendicularly relative the longitudinal axis thereof. When the cutting tip 20 is disposed below the laser beam L, a continuous, uninterrupted path of laser light is transmitted from the laser emitting module 52 to the laser receiving module 54. When it is determined that the cutting tip 20 is disposed below the level of the laser beam L (i.e., a continuous laser beam L is transmitted between the laser emitting and receiving modules 52, 54), the stepper motor 82 is deactivated and the downward vertical movement of the lead screw 96 stopped. Immediately thereafter, the stepper motor 82 is re-energized in a manner facilitating the clockwise rotation of the magnet elements 100 thus causing the upward vertical movement of the lead screw 96 and distal end 136 of the pin portion 134 thereof. Upward movement of the lead screw 96 facilitates the simultaneous upward movement of the cutting tip 20 toward the laser beam L. At the precise moment the cutting tip 20 interrupts the laser beam L, the stepper motor 82 is deactivated, thus resulting in the cutting tip 20 being spaced from the top surface 44 of the drill seat 30 by the separation distance SD. If, after the initial insertion of the drill bit 14 into the drill seat 30, the cutting tip 20 thereof is disposed below the laser beam L (i.e., a continuous, uninterrupted laser beam is generated between the laser emitting and receiving modules 52, 54) the initial step of lowering the cutting tip by the counter-clockwise rotation of the magnet elements 100 of the stepper motor 82 is eliminated. In this respect, the stepper motor 82 will be activated in a manner so as to facilitate only the upward vertical movement of the lead screw 96 to precisely position the cutting tip 20 within the laser beam L.

When the cutting tip 20 is positioned within the laser beam L and thus spaced from the top surface 44 by the separation distance SD, a slight gap will be defined between the surface 12a of the locating ring 12 and the top surface 44 of the drill seat 30. Thereafter, the pneumatic ram assembly 34 is actuated to facilitate the rapid downward movement of the tool head 38 attached to the distal end of the piston rod 37. In the preferred embodiment, when the piston rod 37 of the cylinder 36 reaches its maximum downward stroke, the distal end of the tool head 38 will be disposed in extremely close proximity to, but will not contact, the top surface 44 of the drill seat 30. When the tool head 38 is actuated downwardly in this manner, the fluted cutting portion, tapered region 18 and upper end of the shank portion 16 of the drill bit are received into the central aperture 40, thus resulting in the upper surface 12a of the locating ring 12 being contacted or "bumped" by the bumping surface 42 defined about the central aperture 40. Importantly, the bumping of the locating ring 12 by the tool head 38 overcomes the frictional or press-fit engagement of the ring 12 upon the shank portion 16 of the drill bit 14 and forces the locating ring 12 downwardly into abutting contact with the top surface 44 of the drill seat 30. Once the locating ring 12 is abutted against the top surface 44, it is spaced from the cutting tip 20 at the desired distance D1. The locating ring 12 is preferably bumped twice by the tool head 38, with the first bump being utilized to force the locating ring 12 into abutting contact with the top surface 44, and the second bump being utilized to jettison any residual flash or debris from the locating ring 12. Additionally, the ram assembly 34 is configured for rapid actuation so that both bumps occur in an extremely short time period.

When the locating ring 12 is bumped downwardly by the tool head 38 in the aforementioned manner, the bottom end of the shank portion 16 of the drill bit 14 is disposed in abutting contact with the distal end 136 of the pin portion 134. As such, even though only the locating ring 12 is being bumped downwardly by the tool head 38, a significant downward force is transmitted through the drill bit 14 and thus into the lead screw 96 via the pin portion 134 thereof. As previously explained, this downward force is transmitted from the lead screw 96 to the bushing 98 due to the threaded engagement therebetween, and is subsequently transmitted from the bushing 98 to the bottom surface of the bore 114 via the thrust bearing assembly 112. As will be recognized, if the thrust bearing assembly 112 were not included in the apparatus 10, repeated bumping operations would eventually cause the bushing 98 to be disengaged from and forced downwardly out of the stepper motor 82.

From time to time, the downward vertical movement of the lead screw 96 in the aforementioned manner will not suffice to dispose the cutting tip 20 below the laser beam L. This problem typically arises when the abutment of the locating ring 12 against the top surface 44 prevents any further downward movement of the drill bit 14 within the drill seat 30, despite the continued downward vertical movement of the lead screw 96 and distal end 136 of the pin portion 134. When such occurs, the spacing between the laser beam L and top surface 44 is slightly increased via the slide assembly 58. In this respect, once a determination is made that continued downward vertical movement of the lead screw 96 will not position the cutting tip 20 below the laser beam L, the cylinder 70 is actuated thus causing the piston rod 72 and end plate 74 to move outwardly away from the cylinder 70. Such outward movement of the end plate 74 causes the stop pin 68 to rotate in a counter-clockwise direction, thus retracting the engagement surface thereof toward the support plate 60 and increasing the separation distance SD due to the resultant upward movement of the laser bar assembly 48 along the slide assembly 58. As previously specified, such upward movement occurs due to the upward biasing force constantly exerted upon the base plate 50 of the laser bar assembly 48 by the biasing springs 64. The total upward movement of the laser beam L which can be achieved via the actuation of the slide assembly 58 is only slight, i.e., approximately 0.003–0.005 inches. However, in many instances, only such slight vertical adjustment is needed to dispose the cutting tip 20 from an initial position above or within the laser beam L to a position below the laser beam L.

The stop pin 68 is rotated in the counter-clockwise direction only as needed to position the cutting tip 20 below the laser beam L. As such, the piston rod 72 of the cylinder 70 will not, in every circumstance, reach its maximum outward stroke during the upward adjustment of the level of the laser beam L. Once the cutting tip 20 is positioned below the laser beam L, the outward movement of the piston rod 72 and end plate 74 away from the cylinder 70, and thus the rotation of the stop pin 68, is immediately stopped. Once the cutting tip 20 is positioned below the laser beam L, the stepper motor 82 is activated in a manner facilitating the upward vertical travel of the lead screw 96 as needed to place the cutting tip 20 within the laser beam L. Thereafter, the bumping operation is conducted in the manner previously described. After the bumping cycle has been completed, the piston rod 72 and end plate 74 are retracted back toward the cylinder 70, thus forcing the laser bar assembly 48 downwardly back to its original position and orienting the laser beam L produced thereby at the original separation distance SD relative the top surface 44 of the drill seat 30.

Referring now to FIGS. 8 and 9, from time to time, the cutting tip 20 of the drill bit 14 is disposed above the laser beam L, even after the level of the laser beam L is raised by the slide assembly 58 in the aforementioned manner. When such occurs, a spanner wrench 138 is engaged to the tapered region 18 of the drill bit 14 in the manner shown, and the ram assembly 34 manually actuated to facilitate a single stroke of the piston rod 37, thus causing the distal end of the tool head 38 to "bump" the spanner wrench 138. Advantageously, this bumping of the spanner wrench 138 by the tool head 38 drives the shank portion 16 of the drill bit 14 downwardly through the locating ring 12 and into the aperture 32 of the drill seat 30. This downward movement of the drill bit 14 into the drill seat 30 normally facilitates the positioning of the cutting tip below the laser beam L.

Since the shank portion 16 of the drill bit 14 is being driven downwardly through the locating ring 12 into the aperture 32, the distal end 136 of the pin portion 134, which is normally abutted against the bottom end of the shank portion 16, must be spaced therefrom. As such, in those instances when the spanner wrench 138 is utilized, the stepper motor 82 is energized in a manner facilitating the downward vertical movement of the lead screw 96 in an amount as needed to create a sufficient gap between the distal end 136 and the shank portion 16 so that no interference occurs when the shank portion 16 is driven downwardly through the locating ring 12. Advantageously, the use of the spanner wrench 138 prevents any damage to the cutting tip 20 or fluted cutting region of the drill bit since the force is transmitted directly from the tool head 38 to the tapered region 18 and hence the shank portion 16 via the spanner wrench 138. Subsequent to the bumping of the spanner wrench 138 by the tool head 38, the spanner wrench 138 is disengaged from the drill bit 14, and the stepper motor 82 activated to facilitate the upward vertical movement of the lead screw 96 as needed to position the cutting tip 20 within the laser beam L. Thereafter, the locating ring 12 is bumped into abutting contact with the top surface 44 of the drill seat 30 via the ram assembly 34 in the same manner as previously discussed.

Referring now to FIGS. 10–15, is a locating ring mounting and positioning apparatus 150 constructed in accordance with a second embodiment of the present invention is illustrated. As previously discussed, the apparatus 10 constructed in accordance with the first embodiment is primarily utilized to reposition the locating ring 12 upon the drill bit 14 subsequent to the resharpening of the cutting tip 20 thereof. The apparatus 150 constructed in accordance with the second embodiment may additionally be utilized to initially mount a locating ring 12 upon a new drill bit 14, and position the locating ring 12 at the distance D1 relative the cutting tip 20 of the drill bit 14.

The apparatus 150 constructed in accordance with the second embodiment includes a ring feed mechanism 152 and a locking mechanism 154 which are not included with the apparatus 10, the structures of which will be described below. However, but for the addition of the ring feed and locking mechanisms 152, 154, the structure of the apparatus 150 is substantially identical to that of the apparatus 10, except for slight modifications to the configuration of the tool head 38a and drill seat 30a thereof, which will also be described infra.

In the second embodiment, the ring feed mechanism 152 comprises a feeder bowl or reservoir hopper 156 which is adapted to store a large volume of locating rings 12. Attached to the bottom of the feeder bowl 156 is an elongate feed tube 158, the inner diameter of which is sized so as to slightly exceed the outer diameter of the locating rings 12. As seen in FIGS. 11 and 12, the top end of the feed tube 158 is attached to the feeder bowl 156 so as to be in communication with the interior thereof. Importantly, to insure that the locating rings are introduced into the feed tube 158 in proper axial orientation (as seen in FIG. 14*a*), the top end opening of the feed tube 158 is overlapped by a plate member which extends inwardly from the sidewall 162 of the feeder bowl 156 in generally parallel relation to the bottom wall 164 thereof. As best seen in FIG. 12, the gap defined between the plate member 160 and bottom wall 64 is sized so as to slightly exceed the width W1 of the locating rings 12, thus assuring that the locating rings 12 are properly oriented prior to entering the top end of the feed tube 158. Though not shown, the ring feed mechanism 152 preferably includes a pressurized air source disposed proximate the feeder bowl 156 and directed therewithin for creating an air stream to force the locating rings 12 disposed within the feeder bowl 156 underneath the plate member 160 and into the feed tube 158.

Positioned adjacent the bottom end of the feed tube 158 is a rotatable feed plate 166 defining an arcuate feed groove 168 disposed in the top surface thereof for receiving a locating ring 12 from the feed tube 158. As seen in FIGS. 13 and 14, one end of the feed groove 168 terminates centrally within the top surface of the feed plate 166, with the opposite end terminating at a lateral edge 170 of the feed plate 166. The portion of the feed groove 168 adjacent the lateral edge 170 is formed having a depth greater than the remainder of the feed groove 168 and defines a groove floor 172. As seen in FIG. 14, the groove floor 172 of the increased depth portion of the feed groove 168 is separated from the bottom end of the feed tube 158 by a vertical distance slightly exceeding the width W1 of the locating ring 12.

The feed plate 166 of the ring feed mechanism 152 is selectively rotatable from a loading position (shown in FIGS. 13 and 14) to an unloading position (shown in FIGS. 14*b* and 14*c*). When the feed plate 166 is in the loading position, the bottom end of the feed tube 158 is positioned immediately above the increased depth portion of the feed groove 168, thus allowing a single locating ring 12 to be dispensed from the bottom end of the feed tube 158 and onto the groove floor 172. Thereafter, the feed plate 166 is rotated in a counter-clockwise direction as shown in FIG. 10. When such rotation occurs, the locating ring 12 resting upon the groove floor 172 moves outwardly from underneath the feed tube 158 since, as previously explained, the width W1 thereof is slightly less than the distance separating the bottom end of the feed tube 158 from the groove floor 172. As seen in FIG. 14*a*, though additional locating rings 12 are axially stacked within the feed tube 158, these locating rings 12 are prevented from escaping the bottom end of the feed tube 158 when rotation of the feed plate 166 is initiated due to the sudden decrease in the depth of the feed groove 168. In this respect, the distance separating the floor of the decreased depth portion of the feed groove 168 from the bottom end of the feed tube 158 is less than the width W1 of the locating rings 12, thus causing a second locating 12 to remain captured within the feed tube 158 as the locating ring 12 resting upon the groove floor 172 is rotated to the unloading position. However, when the feed plate 166 is rotated in a clockwise direction back to its original loading position, the locating ring previously prevented from escaping the bottom end of the feed tube 158 will be rested upon the groove floor 172 and thus be able to be rotated out from underneath the feed tube 158 during a subsequent rotation of the feed plate 166 in the counter-clockwise direction to the unloading position. The ring feed mechanism 152, and more particularly the feed tube 158 thereof, is attached to the upper portion 24 of the housing 22 via a mounting block 173.

When a locating ring 12 resting on the groove floor 172 is rotated out from underneath the bottom end of the feed tube 158 to the unloading position, the tool head 38*a* of the ram assembly of the apparatus 150 is moved a short distance downwardly. This downward movement causes the upper portion of the locating ring 12 protruding upwardly beyond the top surface of the feed plate 166 to be received into the enlarged lower end of the central aperture 40*a* which has a diameter slightly exceeding the diameter of the locating ring 12, and a depth approximately one-half of the width W1 of the locating ring 12. The locating ring 12 is fully received into the tool head 38*a* when the upper surface 12*a* of the locating ring 12 is contacted by the annular bumping surface 42*a* circumventing the reduced diameter portion of the central aperture 40*a*.

To maintain the locating ring 12 within the enlarged portion of the central aperture 40*a* a detent mechanism 174 is disposed within the tool head 38*a* adjacent the distal end thereof. As shown, the detent mechanism 174 comprises an aperture 178 which extends laterally from the outer surface of the tool head 38*a* and into communication with the enlarged lower end of the central aperture 40*a*. The portion of the aperture 178 disposed closest to the outer surface of the tool head 38*a* is internally threaded and adapted to receive a set screw 180. Disposed within the aperture 178 inboard of the set screw 180 is a ball bearing 182. Additionally, disposed between the ball bearing 182 and set screw 180 is a spring 184 which is operable to bias the ball bearing 182 radially inward toward the enlarged lower end of the central aperture 40*a*. Importantly, the ball bearing 182 is biased by the spring 184 against a beveled surface formed about the end of the aperture 178 communicating with the central aperture 40*a* which allows only a portion of the ball bearing 182 to protrude into the central aperture 40*a*. When the locating ring is initially received into the central aperture 40*a*, the biasing force of the spring 184 is overcome thus forcing the ball bearing 182 toward the set screw 180 and allowing the locating ring 12 to be fully received into the central aperture 40*a* in the aforementioned manner. Thereafter, the biasing force exerted against the ball bearing 182 by the spring 184 causes the same to extend radially inward to abut the outer surface of the locating ring 12, thus maintaining the locating ring 12 within the central aperture 40*a* of the tool head 38*a*. As will be recognized, the amount of holding force that is exerted upon the locating ring 12 by the detent mechanism 174 may be adjusted via the selective rotation of the set screw 180.

In operation, a new drill bit 14 is initially inserted into the drill seat 30*a*, with no locating ring 12 being disposed upon the shank portion 16 of the drill bit 14. Subsequent to the insertion of the shank portion 16 into the drill seat 30*a*, the laser bar assembly of the apparatus 150 produces the laser beam L. Thereafter, the cutting tip 20 of the drill bit 14 is positioned within the laser beam L via the adjustment mechanism of the apparatus 150, in the same manner as previously described with respect to the apparatus 10. After the cutting tip 20 has been placed within the laser beam L, the feed plate 166 of the ring feed mechanism 152 is rotated in a counter-clockwise direction, thus transporting a single locating ring 12 from the loading position to the unloading position. Once the locating ring 12 has been disposed in the unloading position, the tool head 58a is moved partially downwardly in a manner causing the upper portion of the locating ring 12 to be received into the enlarged lower end of the central aperture 40a, as shown in FIG. 14c. As previously explained, once received into the central aperture 40a, the locating ring is retained therewithin by the detent mechanism 174 included with the tool head 38a. Subsequent to the receipt of the locating ring 12 into the central aperture 40a, the tool head 38a may be actuated upwardly to its original position. The feed plate 166 is then rotated in a clockwise direction back to the loading position whereat another locating ring 12 is positioned upon the groove floor 172 in the previously described manner in preparation for the next cycle of the feed plate 166.

After the feed plate 166 has returned to the loading position, the tool head 38a is fully actuated downwardly, thus causing the fluted cutting portion, tapered region 18 and upper end of the shank portion 16 of the drill bit 14 to be received into the central aperture 40a, and the locating ring 12 to be pushed onto the shank portion 16 and into abutting contact with the top surface of the drill seat 30a. Since, as previously specified, the cutting tip 20 is spaced from the top surface of the drill seat 30a by the separation distance SD, the locating ring 12 is frictionally positioned upon the shank portion 16 of the drill bit 14 at the distance D1 relative the cutting tip 20 of the drill bit 14. Thereafter, the tool head 38a is retracted upwardly to its original position, with the drill bit 14 including the locating ring 12 thereon being removed from the drill seat 30a. As will be recognized, the amount of downward vertical movement of the tool head 38a which occurs when the locating ring 12 is pushed upon the shank portion 16 is greater than when the locating ring 12 is initially loaded into the tool head 38a.

Due to the inclusion of the detent mechanism 174 in the tool head 38a, the drill bit 14 is preferably held within the drill seat 30a prior to the return of the tool head 38a to its upper, unactuated position, i.e. due to the holding force exerted On the locating ring 12 by the detent mechanism 174, the upward vertical movement of the tool head 38a would pull the drill bit 14 upwardly and out of the drill seat 30a after the locating ring 12 has been pushed upon the shank portion 16 thereof. To prevent the drill bit 14 from being pulled out of the drill seat 30a by the upward travel of the tool head 38a, the apparatus 150 is provided with the previously described locking mechanism 154.

Referring now to FIGS. 1, 4 and 15, the locking mechanism 154 generally comprises a cylinder 186 attached to the top surface 28 of the lower portion 26 and having a reciprocal locking pin 188 extending axially therefrom. The distal end 190 of the locking pin 188 has a blunt, generally flat configuration and is slidably receivable into a laterally extending aperture disposed within the drill seat 30a which communicates with the aperture 32a thereof. The locking pin 188 is selectively actuatable by the cylinder 186 between an unlocked position whereat the distal end 190 is spaced from the shank portion 16 of a drill bit 14 inserted into the drill seat 30a, and a locked position whereat the distal end 190 of the locking pin 188 is abutted against the shank portion 16, thus locking the drill bit 14 within the drill seat 30a. Prior to the downward vertical movement of the tool head 38a to push the locating ring 12 upon the shank portion 16, the locking pin 188 is actuated to the locked position. As such, when the tool head 38a is moved Vertically upwardly back to its original position subsequent to positioning the locating ring 12 upon the shank portion 16, the drill bit 14 is maintained within the drill seat 30a and prevented from moving upwardly concurrently with the tool head 38a.

Both the apparatus 10 constructed in accordance with the first embodiment and the apparatus 150 constructed in accordance with the second embodiment are provided with a programmable control unit 192 which is attached to the upper portion 24 of the housing 22. The control unit 192 allows the separation distance SD, as well as the distance D1 to be programmed into the apparatus 10, 150. In the apparatus 10, the control unit 192 is electrically interfaced to the ram assembly 34, laser bar assembly 48, stepper motor 82 and slide assembly 58 for controlling and coordinating the operations thereof. Similarly, in the apparatus 150, the control unit 192 is electrically interfaced to these components, as well as the ring feed mechanism 152 and locking mechanism 154.

Due to the inclusion of the laser bar assembly 48 with the apparatus 10, 150 and the use of the laser beam L as the primary measurement reference, the initial placement of a locating ring 12 onto a drill bit 14 and re-positioning of a locating ring 12 upon a re-sharpened drill bit 14 is accomplished without having to interface a measurement device directly to either the locating ring 12 or drill bit 14. This is in contrast to prior art techniques wherein the placement and re-positioning of the locating ring 12 upon the drill bit 14 is accomplished by contact gauging. Additionally, the non-contact gauging afforded by-the use of the laser beam L facilitates high production speeds for both the apparatus 10 and 150, wherein over 800 pieces per hour may be processed thereby.

The apparatus 10 and apparatus 150 are each further adapted to determine the overall length (OAL) of every drill bit 14 placed into the drill seat 30, 30a, and to determine whether the overall length of the drill bit 14 meets or exceeds a pre-set minimum OAL programmed into the control unit 192. At the completion of each cycle of the apparatus 10, 150, the stepper motor 82 is activated in a manner causing the lead screw 96 to return to a base or home position whereat the distal end 136 of the pin portion 134 thereof is separated from the laser beam L (which is itself disposed at the original separation distance SD relative the top surface 44 of the drill seat 30, 30a) by a measurement distance MD. The measurement distance MD between the laser beam L and the distal end 136 of the lead screw 96 is programmed into the programmable control unit 192. As previously described, subsequent to being inserted into the drill seat 30, 30a, the level of the cutting tip 20 of the drill bit 14 is selectively lowered and/or raised so as to precisely position the same in the path of the laser beam L. The lowering of the drill bit 14 within the drill seat 30, 30a is accomplished by activating the stepper motor 82 in a manner facilitating the counterclockwise rotation of the magnet elements 100 which causes the lead screw 96 to move in a downward vertical direction and the distal end 136 to move downwardly within the aperture 32, 32a. Conversely, the raising of the drill bit 14 within the drill seat 30, 30a is accomplished by activating the stepper motor in a manner facilitating the clockwise rotation of the magnet elements 100 which causes the lead screw 96 to move in an upward vertical direction and the distal end 136 to move upwardly within the aperture 32, 32a.

The electronic counter 89 interfaced to the stepper motor 82 is adapted to count the "steps" of the stepper motor 82 which occur as the cutting tip 20 of the drill bit 14 is being precisely positioned within the laser beam L subsequent to the insertion of the drill bit 14 into the drill seat 30, 30a. The counter 89 is electrically connected to the control unit 192 which includes a specialized circuit design adapted to convert the motor "steps" relayed from the counter 89 to 0.001 inch increment equivalents. The control unit 192 is programmed to add a 0.001 inch increment to the measurement distance MD for each step of the stepper motor 82 which occurs during the counter-clockwise rotation of the magnet elements 100, and to subtract a 0.001 inch increment from the measurement distance MD for every step of the stepper motor 82 which occurs during the clockwise rotation of the magnet elements 100. As such, the measurement distance MD constantly changes as the drill bit 14 is lowered and/or raised within the drill seat 30, 30a as needed to position the cutting tip 20 in the path of the laser beam L.

When the cutting tip 20 is precisely positioned in the path of the laser beam L, the control unit 192 generates an overall length measurement of the drill bit 14. The overall length measurement corresponds to the measurement distance MD as modified by the addition of the 0.001 inch increments attributable to motor steps occurring during the counter-clockwise rotation of the magnet elements 100, and subtraction of the 0.001 inch increments attributable to motor steps occurring during the clockwise rotation of the magnet elements 100. As will be recognized, the positioning of the distal end 136 at a level below the home position when the cutting tip 20 is placed within the laser beam L will result in the generation of an overall length measurement exceeding the measurement distance MD. Conversely, the positioning of the distal lend 136 at a level above the home position when the cutting tip 20 is placed in the laser beam L will result in the generation of an overall length measurement less than the measurement distance MD.

Since the bottom end of the drill bit 14 is abutted against the distal end 136 and the measurement distance MD (i.e., the distance separating the distal end 136 from the laser beam L) is programmed into the control unit 192, the subtraction and/or addition of the 0.001 inch increments attributable to the vertical travel of the distal end 136 relative its home position facilitates a highly accurate overall length measurement of the drill bit 14 when the cutting tip 20 is positioned within the laser beam L. Importantly, the control unit 192 is adapted to generate an alert signal if the overall length measurement is less than the preset minimum OAL programmed thereinto. If such an alert signal is generated, the control unit 192 is adapted to disable the apparatus 10, 150 until the undersized drill bit 14 is removed from within the drill seat 30, 30a. As a safety feature, attached to the top surface 28 of the lower portion 26 in both the apparatus 10 and 150 is a light curtain assembly 194 which includes both an emitter portion 196 and a receiver portion 198. The light curtain assembly 194 is adapted to produce a light curtain which extends between the user and the drill seat 30, 30a and tool head 38, 38a for purposes of disabling system operation until the operators' hands are removed from the light curtain thereby preventing any inadvertent injury to the user as may be caused by the rapidly reciprocating tool head 38, 38a.

Additional modifications and improvements of the present invention may also be apparent to those skilled in the art. Thus, the particular combination of parts described and illustrated herein is intended to represent only certain embodiments of the present invention, and is not intended to serve as limitations of alternative devices within the spirit and scope of the invention.

What is claimed is:

1. An apparatus for adjusting the axial position of a locating ring upon a drill bit having a longitudinal axis, a shank portion and a cutting tip, comprising:

a housing;

a drill seat attached to said housing for slidably receiving the shank portion of the drill bit;

an adjustment mechanism attached to said housing for positioning the cutting tip a desired separation distance from the drill seat; and a reciprocal ram assembly attached to said housing for selectively bumping said locating ring into abutting contact with said drill seat subsequent to the shank portion being inserted into the drill seat and the cutting tip being positioned at the separation distance from the drill seat.

2. The apparatus of claim 1 wherein said adjustment mechanism comprises:

an optical reference system for producing an optical beam which travels perpendicularly relative to the longitudinal axis of the drill bit and is spaced from the drill seat by the separation distance; and a reversible stepper motor having a lead screw cooperatively engaged thereto which is selectively extensible from the stepper motor and retractable thereinto, said lead screw defining top and bottom ends and being interfaced to said drill seat in a manner wherein the top end may come into abutting contact with the shank portion of the drill bit inserted into the drill seat;

said stepper motor being adapted to retract and extend the lead screw as needed to facilitate precise placement of the cutting tip of the drill bit inserted into the drill seat into the path of the optical beam so as to position the cutting tip at the separation distance.

3. The apparatus of claim 2 wherein said adjustment mechanism further comprises a thrust bearing cooperatively engaged to said stepper motor and said lead screw for absorbing force transmitted through the lead screw when the locating ring is bumped by the ram.

4. The apparatus of claim 2 wherein said optical reference system is attached to a slide assembly for selectively adjusting the separation distance of the optical beam from the drill seat.

5. The apparatus of claim 4 wherein said slide assembly comprises:

a support plate attached to said housing;

at least one elongate guide rod attached to and extending between said support plate and said housing, said optical reference system being slidably attached to said guide rod;

at least one biasing spring attached to and extending between said optical reference system and said housing for biasing said optical reference system toward said support plate; and an adjustable stop mechanism attached to said support plate for setting the separation distance of the optical beam from the drill seat.

6. The apparatus of claim 5 wherein said stop mechanism comprises:

a stop pin cooperatively engaged to said support plate and defining an engagement surface in constant abutting contact with said optical reference system which is biased thereagainst by said biasing spring;

a cylinder disposed within said housing, said cylinder having a reciprocal piston rod extending therefrom; and a linkage having a first end attached to said piston rod and a second end attached to said stop pin;

wherein the movement of said piston rod in a first direction is operable to retract said engagement surface toward said support plate thus increasing the separation distance between said optical beam and said drill seat, and the movement of said piston rod in a second direction opposite the first direction is operable to extend the engagement surface away from said support plate, thus decreasing the separation distance between said optical beam and said drill seat.

7. The apparatus of claim 6 wherein said stop pin comprises a micrometer.

8. The apparatus of claim 1 wherein said ram comprises:

a cylinder attached to said housing;

a reciprocal piston rod extending axially from said cylinder; and a tool head attached to the distal end of said piston rod, said tool head defining a central aperture in coaxial alignment with the longitudinal axis of the drill bit and sized to receive the cutting tip and shank portion thereof, and an annular bumping surface circumventing the central aperture and sized to contact the locating ring when the cutting tip and shank portion are received into the central aperture.

9. The apparatus of claim 8 further comprising a ring feed mechanism attached to said housing for initially feeding a locating ring onto the shank portion of the drill bit inserted into the drill seat.

10. The apparatus of claim 9 wherein said ring feed mechanism comprises:

a feeder bowl attached to said housing and adapted to accommodate a plurality of locating rings;

a feed tube having a top end in communication with said feeder bowl and a bottom end; and a rotatable feed plate positioned adjacent the bottom end of the feed tube and defining an arcuate feed groove disposed therein for receiving a locating ring from said feed tube;

said feed plate being selectively rotatable from a loading position whereat said locating ring is partially disposed within said groove below said feed tube and an unloading position whereat said locating ring is partially disposed within said groove away from said feed tube.

11. The apparatus of claim 10 wherein said central aperture includes a distal portion which is sized to partially receive said locating ring, and said tool head is adapted to grasp the locating ring when received into the distal portion of the central aperture.

12. The apparatus of claim 9 wherein said drill seat further comprises a locking mechanism for selectively locking the shank portion of a drill bit inserted into the drill seat therewithin.

13. The apparatus of claim 12 wherein said locking mechanism comprises:

a cylinder attached to said housing; and a reciprocal locking pin extending axially from said cylinder and having a distal end slidably engaged to said drill seat;

said locking pin being selectively actuatable between an unlocked position whereat the distal end of said locking pin is spaced from the shank portion of the drill bit and a locked position whereat the distal end of the locking pin is abutted against the shank portion of the drill bit.

14. The apparatus of claim 9 wherein said feeder mechanism further comprises a pressurized air source disposed proximate said feeder bowl and directed therewithin for creating an air stream to force locating rings disposed within said feeder bowl into said feed tube.

15. The apparatus of claim 4 further comprising a programmable control unit electrically interfaced to said ram, said optical reference system, said stepper motor, and said slide assembly for controlling and coordinating the operations thereof.

16. The apparatus of claim 12 further comprising a programmable control unit electrically interfaced to said adjustment mechanism, said ram, said ring feed mechanism and said locking mechanism for controlling and coordinating the operations thereof.

* * * * *